(12) United States Patent
Belogolovyi et al.

(10) Patent No.: US 7,716,561 B2
(45) Date of Patent: May 11, 2010

(54) MULTI-THRESHOLD RELIABILITY DECODING OF LOW-DENSITY PARITY CHECK CODES

(75) Inventors: Andrey Vladimirovich Belogolovyi, Saint Petersburg (RU); Evguenii A. Kruk, Saint Petersburg (RU); Peter Vladimirovich Trifonov, Saint Petersburg (RU)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 11/466,292

(22) Filed: Aug. 22, 2006

(65) Prior Publication Data

US 2007/0011586 A1    Jan. 11, 2007

Related U.S. Application Data

(63) Continuation of application No. PCT/RU2004/000123, filed on Mar. 31, 2004.

(51) Int. Cl.
*H03M 13/00* (2006.01)
*G06F 11/00* (2006.01)

(52) U.S. Cl. .................. 714/780; 714/800
(58) Field of Classification Search .......... 714/746, 714/780, 760, 800–801
See application file for complete search history.

(56) References Cited

U.S. PATENT DOCUMENTS

| 5,481,614 | A | 1/1996 | Johnston |
| 5,819,212 | A | 10/1998 | Matsumoto et al. |
| 6,614,858 | B1 * | 9/2003 | Pekarich et al. ............. 375/340 |
| 6,633,856 | B2 | 10/2003 | Richardson et al. |
| 6,771,772 | B1 | 8/2004 | Tanrikulu |
| 2008/0086670 | A1 | 4/2008 | Krouk et al. |
| 2009/0222711 | A1 | 9/2009 | Belogolovy |

FOREIGN PATENT DOCUMENTS

| RU | 2146850 | 3/2000 |
| RU | 2216851 | 11/2003 |
| SD | 985959 | 12/1982 |
| TW | 200412722 A | 7/2004 |
| WO | WO-9419877 | 9/1994 |
| WO | WO-03063135 A1 | 7/2003 |
| WO | WO-2005/096509 A1 | 10/2005 |

OTHER PUBLICATIONS

Inaba, Y., et al., "Performance of Low Density Parity Check (LDPC) Codes With Bootstrap Decoding Algorithm on a Fast Fading Channel", *IEEE 59th Vehicular Technology Conference, 2004. VTC 2004-Spring.*, (May 17-19, 2004), 333-337.

* cited by examiner

*Primary Examiner*—Shelly A Chase
(74) *Attorney, Agent, or Firm*—Schwegman, Lundberg & Woessner, P.A.

(57) ABSTRACT

A method and apparatus are provided for error correction of a communication signal. A multiple threshold scheme for iteratively decoding a received codeword includes using a comparison of an updated bit reliability with a threshold to generate a reconstructed version of the received codeword. At each iteration the bit reliability and the reconstructed codeword are updated based on a comparison using a threshold that has been updated for the given iteration. Embodiments include decoding and/or associated encoding methods and apparatus using a threshold having two of more values during the iterative decoding.

46 Claims, 4 Drawing Sheets

US 7,716,561 B2

MULTI-THRESHOLD RELIABILITY DECODING OF LOW-DENSITY PARITY CHECK CODES

RELATED APPLICATION(S)

This application is a continuation under 35 U.S.C. 111(a) of International Application No. PCT/RU2004/000123 filed on Mar. 31, 2004, which is incorporated herein by reference.

TECHNICAL FIELD

Embodiments of the invention relate generally to error correcting in communication signals.

BACKGROUND

A communication channel, whether it is a fiber optic channel, a co-axial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits and in which a number of the bits are information (message) bits and a number of bits are used for error correction. A codeword having a length of n bits includes k bits for the message length of the code and r=n−k redundant bits. The r bits are for correction and may be r parity check bits. A parity check matrix, H, contains a set of parity check equations that define the codeword according to the relation:

$$HC^T = 0,$$

where C is the n-dimensional vector of the codeword bits. At a receiver if this relation is not satisfied, then the received codeword is not valid and must either be corrected or retransmitted.

A variety of schemes for decoding a codeword that has propagated through a communication channel exist. Some schemes may provide accuracy, and other schemes may provide fast decoding. In high speed data communication what is needed is a decoding scheme that is accurate and fast, but at the same time can be implemented without a significant amount of complexity.

DETAILED DESCRIPTION

Figure 1:
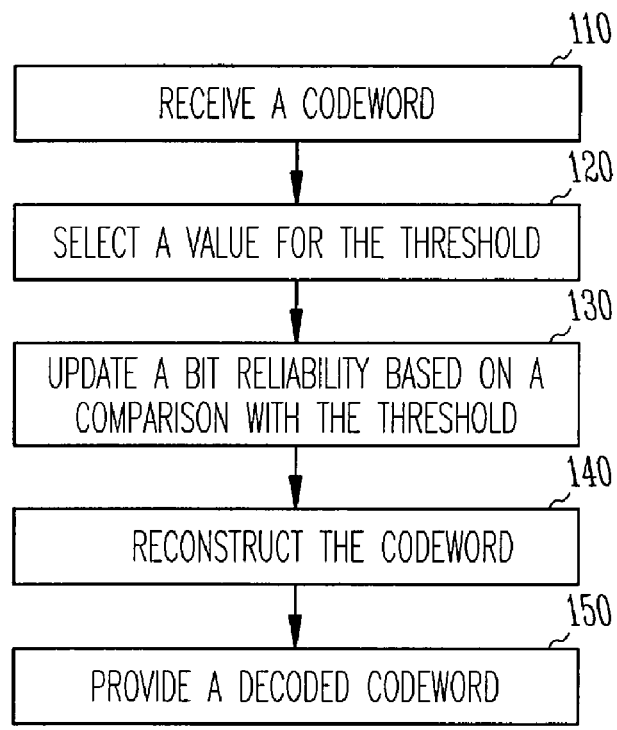
FIG. 1 shows a flow diagram of an embodiment of a method for iteratively decoding information received from a communication channel, according to the present invention.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Low-density parity check (LDPC) codes provide a powerful forward error correcting tool in high-speed communication systems due to the low decoding complexity and the bit-error rate (BER) achieved in an additive white Gaussian noise (AWGN) channel. Conventional LDPC decoders work using a one-threshold decoding scheme. Examples of known LDPC decoders include, among others, the min-sum algorithm, the a posteriori probability (APP) decoding algorithm, and the uniformly most powerful (UMP) decoder.

LDPC codes use a parity check matrix containing mostly zeros and a limited number of ones. A binary $(n, \gamma, \rho)$ LDPC code has a codeword length, or block length, of n bits and a parity check matrix with exactly $\gamma$ ones in each column and exactly $\rho$ ones in each row. In the LDPC code, each code bit is checked by $\gamma$ parity checks and each parity check uses $\rho$ code bits. Further, the code has a rate, R, defined as R=k/n, where k is the number of message (information) bits in the codeword having n bits.

An iterative decoding process may include checking as to whether or not the parity check equation for each received bit from a channel is satisfied. If all the parity check equations are satisfied, the received bits are taken to be the codeword transmitted. If the majority of parity check equations for a given received bit are not satisfied, the given received bit may be flipped; otherwise the value of the given received bit is maintained. Flipping a bit means changing a zero to a one or a one to a zero. After the codeword is reconstructed with the flipping of a bit, the parity check equations are again checked. If all the parity check equations are satisfied, the received bits are taken to be the codeword transmitted, otherwise the iterative procedure continues until a maximum number of allowed iterations is reached.

In LDPC decoding, a belief propagation decoding algorithm can be employed using probabilistic values. Typically, iterative decoding of an LDPC code deals with determining the most likely vector x, where $Hx^T \mod 2 = 0$. The likelihood of x may be given by the product of probabilities that for each bit location, n, $x_n = x$. For a binary codeword, x takes of the value of 0 and 1, so that the probability that x=1 equals one minus the probability that x=0. Further, the probabilistic values may be represented by log-likelihood ratios. For a binary signal with p defined as the probability of a 1, then a log-likelihood ratio (LLR) can be given by $$LLR(p) = \log_e((1-p)/p).$$

Sum-Product Decoding Performs Decoding Using LLR Values.

With respect to the process regarding flipping a received bit discussed above, an initial hard decision was made on the signal received from the communication channel. A hard decision is made on a bit by evaluating that bit individually. For a hard decision for a binary bit, the decoder makes the bit a 1 or a 0 if the bit is less than or greater than a fixed value set by the decoder. With the fixed value set by the decoder at zero, a hard decision would set a bit equal to 1 if the received signal for the bit is positive and set the bit equal to 0 if the received signal is negative. Alternately, a hard decision may set a bit equal to 1 if the received signal for the bit is negative and set the bit equal to 0 if the received signal is positive.

A soft decision is one in which the likelihood that a bit should represent a one or zero is taken into account when determining the value of the bit from the received signal. Soft decision decoders may use information relating to the confidence of the received signal (soft received information) and knowledge of the properties of the channel to provide probabilistic expressions for a received signal relative to the transmitted signal. While a hard decision for a binary process provides a hard decision vector where the vector locations, or vector bits, are either a one or a zero, a soft decision may provide a hard decision vector and a reliabilities, or bits reliabilities, vector. The binary hard decision vector provided by the soft decision is a vector of ones and zeros, where each vector bit is generated individually with respect to a fixed criteria. The reliabilities vector includes a set of bit reliabilities, each bit reliability corresponding to a bit of the associated hard decision vector. The bit reliability provides a measure of its confidence of the corresponding bit in the hard decision vector. The bit reliability may take the form of a probability, a log-likelihood ratio, or other weighted factor correlated to the communication channel through which a received codeword is transmitted. A bit reliability may be correlated directly to the magnitude of the signal representing a received bit.

As is known to those skilled in the art, various decoding schemes implement soft decoding schemes using probabilities. One scheme in its soft decision processes computes the a posteriori probability for each codeword bit, which is the probability that the given bit is a one conditioned on the event that all parity check constraints are satisfied. An intrinsic or a priori probability is the bit probability independent of code constraints and an extrinsic probability represents what has been learnt. For example, in a sum-product algorithm for decoding, a log-likelihood ratio, LLR, of a received signal representing a bit is set based on knowledge of the channel. For an AWGN channel with a signal-to-noise ratio, SNR, the initial LLR for that bit may be set to $$LLR_i = \frac{2Y_i}{\sigma^2},$$

where $Y_i$ is the received signal, $\sigma$ is the AWGN standard deviation. The standard deviation can be defined via AWGN SNR as $$\sigma = \sqrt{\frac{n}{2 \cdot 10^{SNR/10} \cdot k}},$$

where n is the code length, k is the message length, and SNR is the SNR per message bit. The $LLR_i$ are functionally related to the reliability, $R_i$, of bit i. The reliability is a measure of the confidence in the value of the bit. Iterative decoding in various schemes includes updating the reliability corresponding to received bits, and/or updating the reliability corresponding to non-zero elements of the parity check matrix, H. Such iterative processes including checking an updated test codeword, x, for validity via the relation, $Hx^T=0$. If the test does not result in a valid codeword, the iterative process continues until a valid codeword is obtained or a maximum number of iterations is made.

In an embodiment, a multi-threshold decoder is constructed to provide an iterative decoding algorithm with reduced complexity and good error-correcting properties for decoding LDPC codes from a soft-output channel. This embodiment for a multi-threshold reliability decoder for fast LDPC decoding operates using a soft channel output, a soft decision, to produce a hard-decision vector and a reliabilities vector of the bits received. The bit reliabilities are used to calculate parity check reliabilities, and an overall parity check reliability is set at a minimum bit reliability value of all bits which are involved in a given parity check. To recalculate bit reliabilities a weighted parity check voting procedure is used, where the weights are the parity check reliabilities. In such embodiments, as the weight of the parity check weight is decreased, the decoding quality is increased. Initially, the bit reliability is assigned to a bit reliability correlated to the value of the bit received. The parity check voting is applied to the current hard-decision vector. Based on the parity check voting compared with a threshold value at the given iteration, the bit reliability is set to a recalculated bit reliability that is increased by a parity check reliability value; otherwise the recalculated bit reliability is decreased by the parity check reliability value.

For each iteration, threshold values are provided, where the threshold values may be calculated during one or more iterations. The threshold values are used for making the decisions as to whether a bit and its associated reliability should be updated. If a particular reliability is less than the threshold value, then the hard decision bit associated with the reliability is inverted and its new reliability is assigned to the absolute value of the recalculated reliability. The decoding scheme is iterative, and the thresholds may differ from one iteration to another, where at least two values of the threshold are provided or scheduled for calculation during the decoding process. Though the thresholds may be calculated during the iteration, these values also may be predefined. In another embodiment, at the first iteration the error-decision threshold is set to the smallest of the bit reliabilities, and then, at all other iterations, the error-decision threshold is set to zero. In this embodiment, the multi-threshold decoding scheme would be a decoding scheme using two thresholds. The two threshold scheme leads to 0.1-0.4 dB bit error rate gain compared to fast decoding without a threshold having multiple values.

An embodiment for a novel scheme that can be implemented in LDPC decoders includes a multi-threshold decision scheme. By multi-threshold decision scheme, it is meant that a threshold value is changed to a computed value or a predefined value during one or more decoding iterations. In an embodiment, during the first iteration a maximum threshold value (by absolute value) is used and in following iterations, a change of threshold is applied in which the threshold decreases. Changing the threshold values allows the use of a high threshold value during the first iteration leading to an absence, or reduction, of error propagation. Thus, if the decoder corrects even a small number of errors, the decoding at following iterations becomes significantly easier. Use of an embodiment of the multi-threshold decoding scheme may lead to a decrease in the number of iterations made during decoding. These embodiments may be realized with a decoding bit error rate close to that of a maximum a posteriori (MAP) decoding scheme.

In an embodiment, a multi-threshold decoder provides an iterative decoder that uses a soft-decision input vector to generate a hard decision vector and its associated reliabilities vector that describes the absolute likelihood value of every bit. At every iteration, the decoder computes the reliability of every parity check equation using the bit reliabilities. Then, for every bit and every parity check, if a parity check equation failed, the corresponding bit reliability (corresponding to a bit or parity check equation) is decreased; otherwise the bit reliability is increased. When all equations are checked, a hard decision is made using the following rule: if the updated bit reliability is greater than a threshold value, the bit and its reliability stay unchanged, otherwise the bit is flipped (inverted), and its reliability is changed as a function of the updated reliability and threshold value. If the updated reliability is less than 0 but larger than the threshold value at that iteration, then the new bit reliability is set to 0. The threshold value is scheduled to be updated at least once during the decoding process. The process is repeated until the codeword is reconstructed or the decoder reaches the maximum allowed number of iterations.

FIG. 1 shows a flow diagram of an embodiment of a method for iteratively decoding information received from a communication channel. At 110, a codeword is received. The codeword may contain a number of information, or message, bits and a number of bits for use in error detection and/or correction. At 120, a value for a threshold is selected. In an embodiment, a value for the threshold is selected using bit reliabilities correlated to the received codeword during each iteration. The selection may be conducted by calculating a minimum comparison reliability, initially constructed from a soft decision process performed on the received codeword that generates a hard decision vector and a reliabilities vector. The bit reliabilities may be correlated to the communication channel. In an embodiment, the bit reliabilities are generated using known, calculated, or estimated properties of the communication channel, such as, but not limited to, the signal to noise ratio associated with signals propagating through the communication channel. In another embodiment, a set of bit reliabilities is initially correlated to a set of received bits, such as, but not limited to, the absolute value of the signal received for each bit position. In an embodiment, the threshold can be selected as one of a pre-determined set of values, where the selection depends on the given code construction, SNR of the channel, and decoding iteration number.

At 130, a bit reliability that has been generated from the received codeword is updated based on a comparison with the threshold value. In various embodiments, a set of bit reliabilities may be generated, compared with the threshold, and updated. At 140, the codeword is reconstructed based on comparisons of computed bit reliabilities with the threshold, where the computed bit reliabilities are derived from the initially generated bit reliabilities. If the reconstructed codeword does not pass a validity test, the process continues with another iteration. The reconstructed codeword may be generated by inverting one or more bits of the version of the codeword in the given iteration. At 150, a reconstructed codeword is provided at the end of the iterative decoding process. If the decoding process is successful, the reconstructed codeword is taken to be the codeword provided at a transmitting location at another end of the communication channel. If the iterative decoding process does not provide a valid codeword at the end of a number of iterations, a retransmission of the codeword would be appropriate. In an embodiment, the method is used to decode an LDPC codeword.

Figure 2:
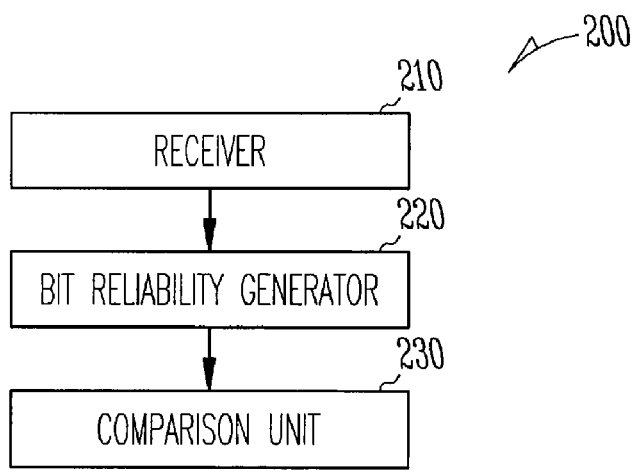
FIG. 2 illustrates an embodiment of an apparatus for iteratively decoding information received from a communication channel, according to the present invention.

FIG. 2 illustrates an embodiment of an apparatus 200 for iteratively decoding information received from a communication channel. Apparatus 200 includes a receiver 210, a bit reliability generator 220, and a comparison unit 230. Receiver 210 acquires data from a communication channel. In an embodiment, the acquired data is in the form of bits in a signal stream, where the bits define a codeword. Alternately, receiver 210 may receive a signal and convert the received signal to a codeword. Bit reliability generator 220 generates one or more bit reliabilities associated with the codeword received. In an embodiment, initial bit reliabilities are generated based on the received codeword and a likelihood ratio related to the probabilities that a binary signal is a one or a zero. Such bit reliabilities may also be correlated to a signal-to-noise ratio of the communication channel from which the received codeword is received. Alternately, initial bit reliabilities can be generated from the received codeword such as by setting the initial bit reliabilities to the absolute value of the received codeword for each bit.

Comparison unit 230 compares bit reliabilities generated from bit reliability generator against a threshold. Subsequent to this comparison, comparison unit 230 updates the bit reliabilities and the bits of a test codeword depending on the results of the comparison with a value of the threshold. Comparison unit 230 uses multiple values for the threshold, depending on a current iteration in the decoding process. The updated bits of the test codeword are evaluated to determine if the updated bits have provided a valid codeword. If a valid codeword has been generated, comparison unit 230 may output the valid codeword or extract the information (message) bits from the codeword and output the message. Comparison unit 230 may be realized in a hardware configuration or in a software configuration. In an embodiment, the values for the threshold used by comparison unit 230 are set according to the iteration in which the value is used. A table of thresholds can be used associating a pre-determined value with an iteration number specified for a given code construction and a given situation in the channel such as the SNR of the channel. In another embodiment, the values for the threshold used by comparison unit 230 are set using the bit reliabilities and the result of a comparison with the threshold value set for the decoding iteration at which comparison unit 230 is operating. In an embodiment, the apparatus 200 decodes an LDPC codeword.

Figure 3:
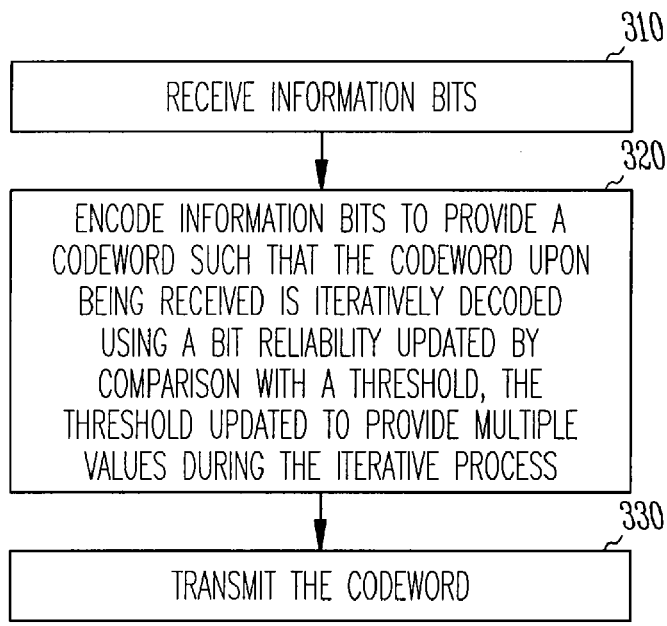
FIG. 3 shows a flow diagram of an embodiment of a method for encoding information to transmit a codeword representative of the information onto a communication channel, according to the present invention.

FIG. 3 shows a flow diagram of an embodiment of a method for encoding information to transmit a codeword representative of the information onto a communication channel. At 310, information is received at an encoder in the form of information bits. At 320, the information bits are encoded to provide a codeword. The encoding is realized in a manner such that a version of the encoded codeword upon being received is iteratively decoded using a bit reliability updated by comparison with a threshold, where the threshold is updated to provide multiple values during the iterative process. If the version of the codeword is received without error at another end of the communication channel on which the codeword was transmitted, the iterative decoding may provide the codeword without correctly the received version of the codeword. If the received version of the transmitted codeword includes errors, the iterative decoding process using multiple thresholds provides a correction process. At 330, the codeword is transmitted onto the communication channel. In an embodiment, the method is used to encode an LDPC codeword.

Figure 4:
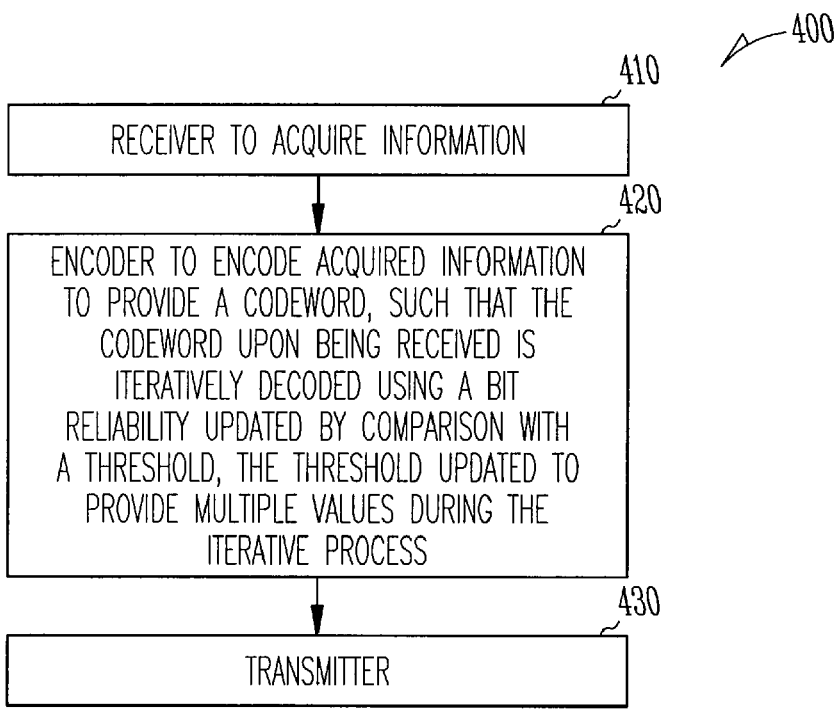
FIG. 4 illustrates an embodiment of an apparatus for encoding information that is iteratively decoded using multiple values for a threshold at a receiving end of a communication channel, according to the present invention.

FIG. 4 illustrates an embodiment of an apparatus 400 for encoding information that is iteratively decoded using multiple values for a threshold at a receiving end of a communication channel. Apparatus 400 includes a receiver 410 to acquire information to encode, an encoder 420, and a transmitter 430. Receiver 410 acquires data provided to apparatus 400 to transmit over a communication channel. Encoder 420 takes the information and generates an encoded word that contains information, message, bits and bits for correction at a receiving end of a transmission channel. The information supplied to encoder 420 may be in the form of information bits. Alternately, encoder 420 may take the supplied information and construct the information bits. Encoder 420 encodes the information into a codeword such that a version of the codeword upon being received is iteratively decoded using a bit reliability updated by comparison with a threshold. The threshold is updated to provide multiple values during the iterative process. Transmitter 430 sends the encoded codeword onto a communication channel.

The communication channel between apparatus using an embodiment of a decoding method using multiple threshold and apparatus using an embodiment of a encoding method associated with the decoding method may include, but is not limited to, a fiber optic channel, a wired channel, a channel reading data stored on a memory unit, or a wireless channel. Additionally, embodiments for decoding and encoding may be adapted for use with any protocol for transmission over any communication channel.

Figure 5:
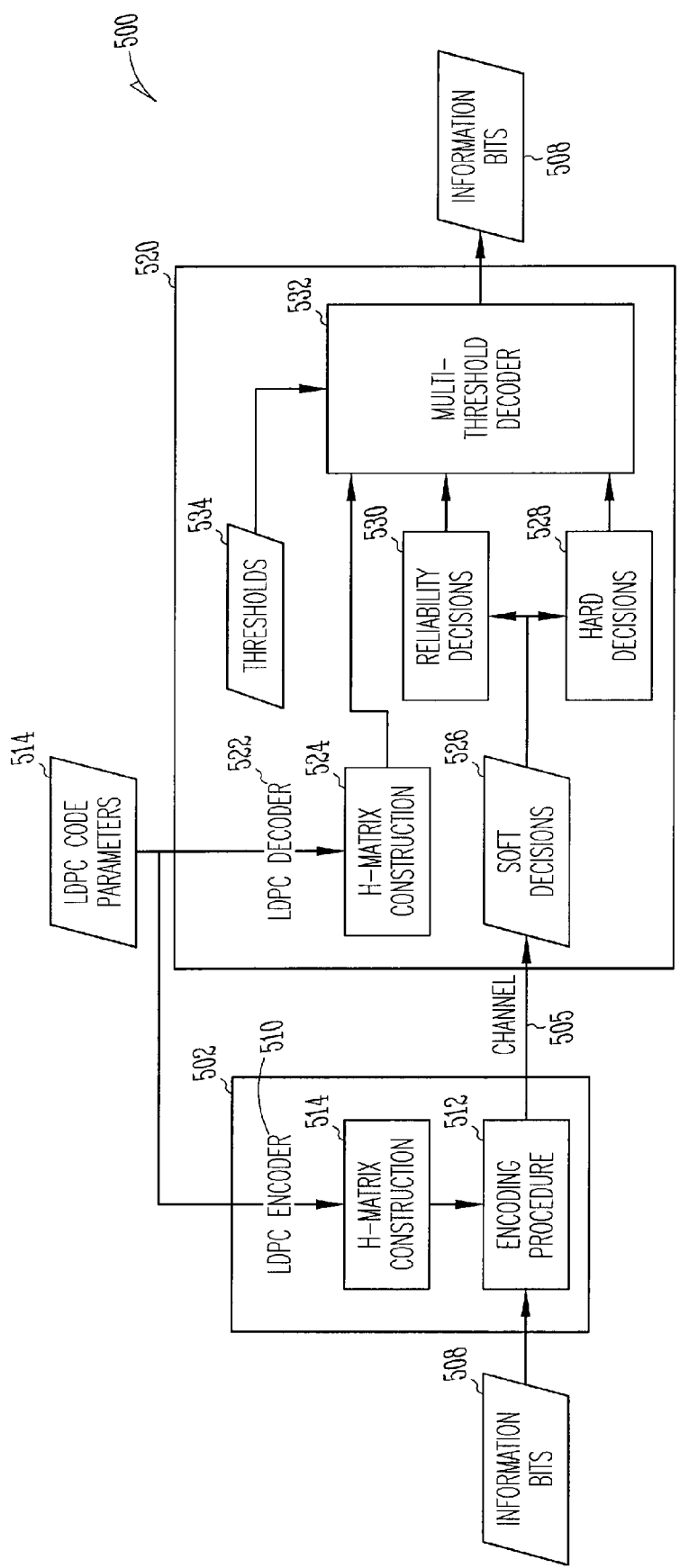
FIG. 5 illustrates a block diagram of an embodiment of a communication network having a system for encoding a low-density parity check codeword and a system for decoding a version of the encoded low-density parity check codeword received from a communication channel between the two systems, according to the present invention

FIG. 5 illustrates a block diagram of an embodiment of a communication network 500 having a system 502 for encoding a low-density parity check codeword and a system 520 for decoding a version of the encoded low-density parity check codeword received from a communication channel 505 between the two systems. An information source provides information bits 508 to an LDPC encoder 510 of system 502. LDPC encoder 510 includes an encoding procedure 512 that uses a H-matrix construction 514 to generate a codeword that is transmitted onto channel 505. H-matrix construction 514 is developed using LDPC code parameters 514 that are provided to system 502 and system 520.

System 520 includes an LDPC decoder 522 that uses LDPC code parameters 514. The LDPC code parameters are used by the H-matrix construction 524 in LDPC decoder 522. A received codeword from channel 505 is provided to an initial decision unit 526 to make soft decisions resulting in hard decisions 528 and reliability decisions 530. Hard decisions 528 are the initial binary bits for a test codeword and reliability decisions are initial bit reliabilities associated with the bits of the test codeword. In an embodiment, hard decisions 528 are binary bits set according to the sign of the corresponding bit of the received codeword. A received bit having a positive value is set to a one and a received bit having a zero value or a negative value is set to zero. Alternately, a received bit having a zero value or a positive value is set to a zero and a received bit having a negative value is set to one. The initial bit reliabilities for each bit of the received codeword may be set the absolute value of the corresponding bit of the received codeword.

Hard decisions 528, reliability decisions 530, H-matrix construction 524 are provided to a multi-threshold decoder 532 to conduct an iterative decoding process to provide information bits 508 from system 520. Multi-threshold decoder 532 uses thresholds 534 against which constructed reliabilities are compared, and bit reliabilities are updated and bits for a test codeword are updated. The constructed reliabilities are developed from the bit reliabilities. In an embodiment, the constructed reliabilities are developed from the initial reliability decisions and calculated check sums. The bits for a test codeword are generated from hard decisions 528 with bits flipped according to the comparisons with the value of the threshold at each iteration. In an embodiment, thresholds 534 are calculated based on the comparison of the constructed bit reliabilities and the value of the threshold for a given iteration. In an embodiment, one set of thresholds 534 are calculated based on the comparison of the constructed bit reliabilities and the value of the threshold for a given iteration and used in a number of other iterations. A second set of thresholds 534 is set at a fixed value, such as zero, and is used in a number of other iterations. The fixed value for the threshold is used in the group of iterations that form the last iterations in the decoding process. Alternately, thresholds 354 are set at pre-determined values depending on the iteration in which the value of the threshold is used.

Various embodiments for communication network 500, system 502, and system 520 may be realized. Communication network 500 may be a land based network using optical fibers, coaxial cable, or wires as a medium for the communication channels between various nodes of communication network 500. Communication network 500 may be realized as a wireless network in which systems 502 and 520 are configured as part of a node of communication network 500 or as part of a wireless receiving device that receives signals from the nodes of communication network 500. Systems 502 and system 520 may be configured as part of, but not limited to, network components such as base stations and may be configured as part of, but not limited to, wireless receiving devices such as handheld communication devices, computers, and laptop computing devices. Though not shown, systems 502 and 520 configured in a wireless communication system 500 include antennas for transmitting and receiving signals that include one more codewords. The decoding and encoding schemes and apparatus do not limit the type or configuration of supporting components such as antennas in the 502, 520 systems. In an embodiment, a substantially omnidirectional antenna is utilized.

Each node of communication network 500 configured as a land based network or as a wireless based network may contain a version of system 502 and/or a version of system 520 or a system that is a combination of system 502 and system 520. Additionally the decoding and encoding processes used in the encoders and decoders of systems 502 and system 520 and other embodiments for decoding and encoding processes and apparatus as described herein may be adapted for the communication standards and protocols used in communication network 500.

Figure 6:
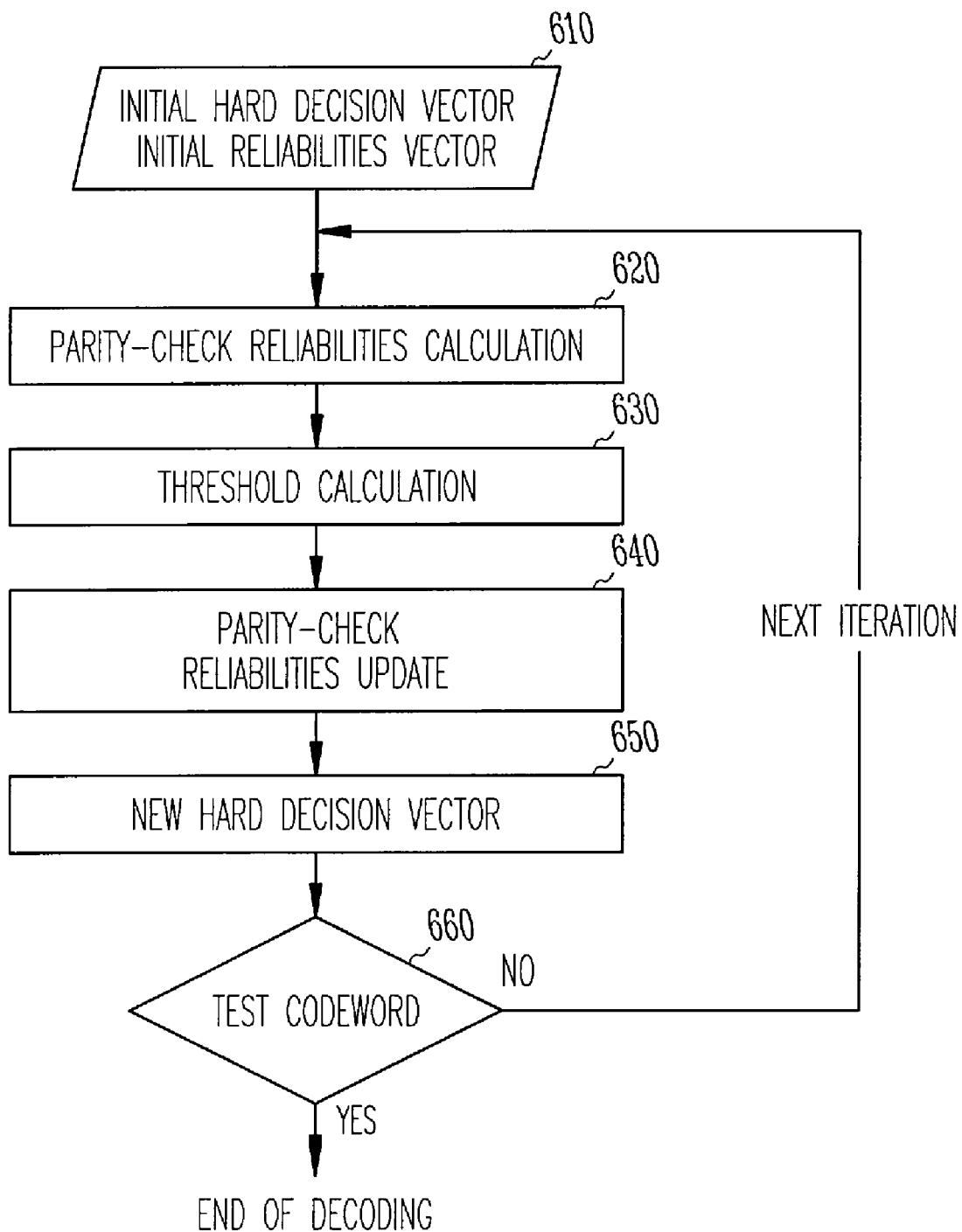
FIG. 6 illustrates a flow diagram of an embodiment of a method for iteratively decoding a low density parity check codeword using a decoder that may be configured as in FIG. 5, according to the present invention.

FIG. 6 illustrates a flow diagram of an embodiment of a method that can be used with an LDPC decoder, such as LDPC decoder 522 as configured as in FIG. 5. At 610, an initial hard decision vector and an initial reliabilities vector is constructed. For a received codeword, $Y=(Y_1, Y_2, \ldots, Y_n)$, let $N(m)$ be the set of codeword positions that are used in an $m^{th}$ parity check: $N(m)=\{n: H_{m,n}=1\}$, where H is the parity check matrix such as provided from H-matrix construction 524 in FIG. 5 and $H_{m,n}=1$ means the value of the H matrix at the m,n position equals one. Further, let M(n) be the set of parity checks that includes $n^{th}$ codeword position: $M(n) = \{m : H_{m,n} = 1\}$.

At initialization, for every element, $Y_i$, of the received vector such as received at the LPDC decoder 522 of FIG. 5, a hard decision $X_i$ and a bit reliability $R_i$ are computed. The bit reliability $R_i$ is set to the absolute value of $Y_i$. The hard decision may set $X_i$ equal to one if $Y_i$ is greater than zero, and $X_i$ equal to zero if $Y_i$ is less than or equal to zero. For every $m \in M(n)$, a parity check bit reliability is defined as $Y_{mn}$, where initially $Y_{mn} = R_n$, and an associated hard decision is defined as $X_{mn}$, where initially $X_{mn} = X_n$.

After the initialization, at 620, an iterative process begins with performing a parity check reliabilities calculation. In an embodiment, for each n and each $m \in M(n)$, check sums, $S_{mn}$ are calculated as:

$S_{mn} = X_n \oplus \Sigma X_{mn'}$ mod 2, where the summation is over $n' \in N(m)\backslash n$. An expression $N(m)\backslash n$ means a set $N(m)$ where bit n is excluded. A value for the minimum of $Y_{mn}$ is identified as:

$Y_{mn\ min} = \min\{Y_{mn'}\}$ for $n' \in N(m)\backslash n$.

At 630, a threshold is calculated. In an embodiment, the threshold is set to the minimum value, over all n, of the set of an updated bit reliabilities defined for each n as, $Z_n = R_n + \Sigma(-1)^{Smn} Y_{mn\ min}$ for $m \in M(m)$.

These updated bit reliabilities will also act as comparison reliabilities in the decoding process. In an embodiment, the multi-value threshold is provided by computing a value for the threshold during each iteration of the decoding process. This is an adaptive approach. In an embodiment, the multi-value threshold may be provided by computing a value for the threshold during the first iteration using the updated bit reliabilities and provided as a fixed value, such as zero, for the remaining iterations. In an embodiment, the multi-value threshold may be provided by computing a value for the threshold during the first iteration using updated bit reliabilities and using that value for the first half of the total number of iterations, and, then, using a fixed value, such as zero, for the last half of the total iterations.

In an embodiment, the multi-value threshold may be provided by using a pre-determined set of thresholds, where the value used is correlated to the iteration number in which it is applied. In an embodiment, pre-determined values are assigned according to parameters of the communication channel from which the received codeword is acquired. These parameters may include a set of signal-to-noise ratios, a set of other channel parameters, or a set of standard deviations correlated to channel parameters. In an embodiment, the pre-determined set of thresholds may be determined through a simulation process. One such process may include simulating the decoding process to provide a set of thresholds for a given signal-to-noise ratio, and setting the threshold for the given signal-to-noise ratio as the mean of the set of simulated thresholds. The process can be conducted for each signal-to-noise ratio in a set of signal-to-noise ratios. Other statistical variations in simulated thresholds for the decoding process may be implemented. These pre-determined values, from whichever embodiment is used to provide these values, may be stored in a table. In addition to software implementation, these tables facilitate hardware implementations using a short lookup table.

In an embodiment, the thresholds are selected for multiple operating modes for decoding. In one mode, the decoding corrects one or two errors. In this mode, the decoding process does not insert additional errors in a codeword vector. In another mode, the decoding process corrects more than one error in one iteration, and may correct one to two errors in a subsequent iteration.

Various combinations for providing the multiple threshold values during the iteration process can be used depending on the allowable complexity desired for a given application.

At 640, parity check bit reliability updating is performed. A set of comparison reliabilities are computed with contribution from the parity check reliabilities, which can be viewed as parity check voting. For each n and each $m \in M(n)$, $Z_{mn}$ is defined as $Z_{mn} = R_n + \Sigma(-1)^{Sm'n} Y_{m'n\ min}$ for $m' \in N(n)\backslash m$.

For each n, the parity check bit reliabilities are updated as are the associated hard decisions $X_{mn}$ based on the comparison reliabilities, $Z_{mn}$. Updating a reliability or a hard decision includes maintaining the value of the reliability or the hard decision, if the comparison indicates that the reliability or the hard decision should remain the same.

$$Y_{mn} = \begin{cases} Z_{mn}, & Z_{mn} > 0 \\ -Z_{mn}, & Z_{mn} < \text{threshold} \\ 0; & \text{otherwise} \end{cases}$$

$$X_{mn} = \begin{cases} X_{mn}, & Z_{mn} > \text{threshold} \\ 1 - X_{mn}, & Z_{mn} < \text{threshold} \end{cases}$$

At 650, a new hard decision vector, C, is generated based on the comparison reliabilities, or updated bit reliabilities, $Z_n$, as $$C_i = \begin{cases} X_i, & Z_i > 0 \\ 1 - X_i, & Z_i < 0. \end{cases}$$

Updating a bit includes maintaining the value of the bit, if the comparison indicates that the bit should remain the same. The terms $C_i$ provide the bits of a test codeword to determine if a valid codeword has been generated. At 660, the test codeword is evaluated for validity. If the following relation occurs, $CH^T \neq 0$, the iterative process returns to 620 using the updated parity check reliability values.

Another embodiment of a method for iteratively decoding an LDPC codeword using a threshold having multiple values includes having the threshold take on only two values during the iteration process. A first value is set at the minimum of the updated reliabilities, $Z_n$, for the $Z_n$ generated in the first iteration prior to making decision comparisons. A second value is set at zero for subsequent iterations. Such an embodiment provides a 0.5 dB gain in decoding time comparing to other known fast decoding schemes having substantially the same complexity.

Embodiments for a multiple threshold scheme decode any LDPC code in every situation. However, for a predefined code and known channel properties, the thresholds can be selected more precisely. In the various embodiments, the number of iterations may be taken to be $\log_2 n$, where n is codeword length. This provides a maximum number of iterations to perform before terminating the iteration prior to reconstructing a valid codeword. Experiments show that threshold tuning and optimization provide enhanced BER gain, but finding the exact dependency of thresholds, code structure, and channel properties is application dependent.

Various embodiments or combination of embodiments for apparatus and methods for decoding and encoding communication signals using a multiple-threshold scheme, as described herein, can be realized in hardware implementations, software implementations, and combinations of hardware and software implementations. These implementations may include a computer-readable medium having computer-executable instructions for performing a decoding and/or encoding method using an embodiment for a scheme using multiple thresholds for iterative decoding. The computer-readable medium is not limited to any one type of medium. The computer-readable medium used will depend on the application using an embodiment of the multiple threshold scheme. In an embodiment, a processor coupled to a receiver and/or transmitter may utilize various forms of memory to which it is coupled and the computer-readable medium to direct decoding and/or encoding of information for data transmission. In an embodiment, the memory may store parameters used to iteratively decode the received codeword.

Though an embodiment of a method using a multi-valued threshold can be used with any LDPC code, the following is presented as a non-limiting example. This example provides an embodiment of a decoding method using a multi-threshold decoder on a low-density parity check code based on Reed Solomon codes with two information symbols (RS-LDPC code). This is an example of a (n, γ, ρ) RS-LDPC code with n=32, γ=4, and ρ=3, with a rate, R, of approximately 0.4, and parity check matrix:

$$H_{RS\text{-}LDPC} = \begin{matrix}
10000000 & 10000000 & 10000000 & 10000000 \\
00001000 & 00000010 & 00000100 & 01000000 \\
00000100 & 00000001 & 00000010 & 00100000 \\
00000010 & 01000000 & 00000001 & 00010000 \\
00000001 & 00100000 & 01000000 & 00001000 \\
01000000 & 00010000 & 00100000 & 00000100 \\
00100000 & 00001000 & 00010000 & 00000010 \\
00010000 & 00000100 & 00001000 & 00000001 \\
10000000 & 00001000 & 00000001 & 01000000 \\
00001000 & 00000001 & 01000000 & 10000000 \\
00000100 & 00000010 & 00001000 & 00000010 \\
00000010 & 00010000 & 10000000 & 00001000 \\
00000001 & 00000100 & 00000100 & 00010000 \\
01000000 & 01000000 & 00010000 & 00000001 \\
00100000 & 10000000 & 00100000 & 00100000 \\
00010000 & 00100000 & 00000010 & 00000100 \\
10000000 & 00000100 & 01000000 & 00100000 \\
00001000 & 00010000 & 00000001 & 00000010 \\
00000100 & 01000000 & 00100000 & 10000000 \\
00000010 & 00000001 & 00000100 & 00000001 \\
00000001 & 00001000 & 10000000 & 00000100 \\
01000000 & 00000010 & 00000010 & 00001000 \\
00100000 & 00100000 & 00001000 & 01000000 \\
00010000 & 10000000 & 00010000 & 00010000
\end{matrix}$$

For this example the received vector, Y={$Y_i$} has a codeword length of 32:

+0.22 +1.47 +0.52 +0.83 −2.38 +0.71 +1.44 −1.95

+0.08 −0.14 +1.19 +0.19 −1.86 −0.16 +0.94 +0.05

-continued

+1.01 −0.42 +0.78 −1.54 −0.84 +1.44 +1.65 −0.45

+0.94 −2.08 −1.31 +1.91 −0.69 +1.04 +1.39 +0.83

In this embodiment, the number of iterations is set at $\log_2 n$, where n is the codeword length. For n=32, the number of iterations is 5. Thresholds for iterations 1, 2, and 3 are set at the minimum of the updated bit reliabilities, $Z_n$, computed in the firs iteration. The thresholds for iterations 4 and 5 are set at 0.

At initialization the hard decision vector, X={$X_i$} is

1111011010110011

1010011010010111 the bit reliabilities, $R_i$, are

+0.22 +1.47 +0.52 +0.83 +2.38 +0.71 +1.44 +1.95

+0.08 +0.14 +1.19 +0.19 +1.86 +0.16 +0.94 +0.05

+1.01 +0.42 +0.78 +1.54 +0.84 +1.44 +1.65 +0.45

+0.94 +2.08 +1.31 +1.91 +0.69 +1.04 +1.39 +0.83 and the parity check reliabilities are initially set as $Y_{mn}$:

Y[0, 0]=+0.22 Y[0, 8]=+0.08 Y[0, 16]=+1.01 Y[0, 24]=+0.94
Y[1, 4]=+2.38 Y[1, 14]=+0.94 Y[1, 21]=+1.44 Y[1, 25]=+2.08
Y[2, 5]=+0.71 Y[2, 15]=+0.05 Y[2, 22]=+1.65 Y[2, 26]=+1.31
Y[3, 6]=+1.44 Y[3, 9]=+0.14 Y[3, 23]=+0.45 Y[3, 27]=+1.91
Y[4, 7]=+1.95 Y[4, 10]=+1.19 Y[4, 17]=+0.42 Y[4, 28]=+0.69
Y[5, 1]=+1.47 Y[5, 11]=+0.19 Y[5, 18]=+0.78 Y[5, 29]=+1.04
Y[6, 2]=+0.52 Y[6, 12]=+1.86 Y[6, 19]=+1.54 Y[6, 30]=+1.39
Y[7, 3]=+0.83 Y[7, 13]=+0.16 Y[7, 20]=+0.84 Y[7, 31]=+0.83
Y[8, 0]=+0.22 Y[8, 12]=+1.86 Y[8, 23]=+0.45 Y[8, 25]=+2.08
Y[9, 4]=+2.38 Y[9, 15]=+0.05 Y[9, 17]=+0.42 Y[9, 24]=+0.94
Y[10, 5]=+0.71 Y[10, 14]=+0.94 Y[10, 20]=+0.84 Y[10, 30]=+1.39
Y[11, 6]=+1.44 Y[11, 11]=+0.19 Y[11, 16]=+1.01 Y[11, 28]=+0.69
Y[12, 7]=+1.95 Y[12, 13]=+0.16 Y[12, 21]=+1.44 Y[12, 27]=+1.91
Y[13, 1]=+1.47 Y[13, 9]=+0.14 Y[13, 19]=+1.54 Y[13, 31]=+0.83
Y[14, 2]=+0.52 Y[14, 8]=+0.08 Y[14, 18]=+0.78 Y[14, 26]=+1.31
Y[15, 3]=+0.83 Y[15, 10]=+1.19 Y[15, 22]=+1.65 Y[15, 29]=+1.04
Y[16, 0]=+0.22 Y[16, 13]=+0.16 Y[16, 17]=+0.42 Y[16, 26]=+1.31

Y[17, 4]=+2.38 Y[17, 11]=+0.19 Y[17, 23]=+0.45 Y[17, 30]=+1.39
Y[18, 5]=+0.71 Y[18, 9]=+0.14 Y[18, 18]=+0.78 Y[18, 24]=+0.94
Y[19, 6]=+1.44 Y[19, 15]=+0.05 Y[19, 21]=+1.44 Y[19, 31]=+0.83
Y[20, 7]=+1.95 Y[20, 12]=+1.86 Y[20, 16]=+1.01 Y[20, 29]=+1.04
Y[21, 1]=+1.47 Y[21, 14]=+00.94 Y[21, 22]=+1.65 Y[21, 28]=+0.69
Y[22, 2]=+0.52 Y[22, 10]=+1.19 Y[22, 20]=+0.84 Y[22, 25]=+2.08
Y[23, 3]=+0.83 Y[23, 8]=+0.08 Y[23, 19]=+1.54 Y[23, 27]=+1.91

At the first iteration, the check sums are computed, and the minimum parity check reliabilities, $Y_{mn\text{-}min}$, are determined as, check sums, $S_{mn}$:

S[0, 0]=0 S[0, 8]=0 S[0, 16]=0 S[0, 24]=0
S[1, 4]=0 S[1, 14]=0 S[1, 21]=0 S[1, 25]=0
S[2, 5]=1 S[2, 15]=1 S[2, 22]=1 S[2, 26]=1
S[3, 6]=0 S[3, 9]=0 S[3, 23]=0 S[3, 27]=0
S[4, 7]=1 S[4, 10]=1 S[4, 17]=1 S[4, 28]=1
S[5, 1]=0 S[5, 11]=0 S[5, 18]=0 S[5, 29]=0
S[6, 2]=0 S[6, 12]=0 S[6, 19]=0 S[6, 30]=0
S[7, 3]=0 S[7, 13]=0 S[7, 20]=0 S[7, 31]=0
S[8, 0]=1 S[8, 12]=1 S[8, 23]=1 S[8, 25]=1
S[9, 4]=0 S[9, 15]=0 S[9, 17]=0 S[9, 24]=0
S[10, 5]=1 S[10, 14]=1 S[10, 20]=1 S[10, 30]=1
S[11, 6]=1 S[11, 11]=1 S[11, 16]=1 S[11, 28]=1
S[12, 7]=0 S[12, 13]=0 S[12, 21]=0 S[12, 27]=0
S[13, 1]=0 S[13, 9]=0 S[13, 19]=0 S[13, 31]=0
S[14, 2]=1 S[14, 8]=1 S[14, 18]=1 S[14, 26]=1
S[15, 3]=0 S[15, 10]=0 S[15, 22]=0 S[15, 29]=0
S[16, 0]=1 S[16, 13]=1 S[16, 17]=1 S[16, 26]=1
S[17, 4]=0 S[17, 11]=0 S[17, 23]=0 S[17, 30]=0
S[18, 5]=1 S[18, 9]=1 S[18, 18]=1 S[18, 24]=1
S[19, 6]=0 S[19, 15]=0 S[19, 21]=0 S[19, 31]=0
S[20, 7]=0 S[20, 12]=0 S[20, 16]=0 S[20, 29]=0
S[21, 1]=1 S[21, 14]=1 S[21, 22]=1 S[21, 28]=1
S[22, 2]=0 S[22, 10]=0 S[22, 20]=0 S[22, 25]=0
S[23, 3]=1 S[23, 8]=1 S[23, 19]=1 S[23, 27]=1

$Y_{mn\text{-}min}$:

Y[0, 0]min=+0.08 Y[0, 8]min=+0.22 Y[0, 16]min=+0.08 Y[0, 24]min=+0.08
Y[1, 4]min=+0.94 Y[1, 14]min=+1.44 Y[1, 21]min=+0.94 Y[1, 25]min=+0.94
Y[2, 5]min=+0.05 Y[2, 15]min=+0.71 Y[2, 22]min=+0.05 Y[2, 26]min=+0.05
Y[3, 6]min=+0.14 Y[3, 9]min=+0.45 Y[3, 23]min=+0.14 Y[3, 27]min=+0.14
Y[4, 7]min=+0.42 Y[4, 10]min=+0.42 Y[4, 17]min=+0.69 Y[4, 28]min=+0.42
Y[5, 1]min=+0.19 Y[5, 11]min=+0.78 Y[5, 18]min=+0.19 Y[5, 29]min=+0.19
Y[6, 2]min=+1.39 Y[6, 12]min=+0.52 Y[6, 19]min=+0.52 Y[6, 30]min=+0.52
Y[7, 3]min=+0.16 Y[7, 13]min=+0.83 Y[7, 20]min=+0.16 Y[7, 31]min=+0.16
Y[8, 0]min=+0.45 Y[8, 12]min=+0.22 Y[8, 23]min=+0.22 Y[8, 25]min=+0.22
Y[9, 4]min=+0.05 Y[9, 15]min=+0.42 Y[9, 17]min=+0.05 Y[9, 24]min=+0.05
Y[10, 5]min=+0.84 Y[10, 14]min=+0.71 Y[10, 20]min=+0.71 Y[10, 30]min=+0.71
Y[11, 6]min=+0.19 Y[11, 11]min=+0.69 Y[11, 16]min=+0.19 Y[11, 28]min=+0.19
Y[12, 7]min=+0.16 Y[12, 13]min=+1.44 Y[12, 21]min=+0.16 Y[12, 27]min=+0.16
Y[13, 1]min=+0.14 Y[13, 9]min=+0.83 Y[13, 19]min=+0.14 Y[13, 31]min=+0.14
Y[14, 2]min=+0.08 Y[14, 8]min=+0.52 Y[14, 18]min=+0.08 Y[14, 26]min=+0.08
Y[15, 3]min=+1.04 Y[15, 10]min=+0.83 Y[15, 22]min=+0.83 Y[15, 29]min=+0.83
Y[16, 0]min=+0.16 Y[16, 13]min=+0.22 Y[16, 17]min=+0.16 Y[16, 26]min=+0.16
Y[17, 4]min=+0.19 Y[17, 11]min=+0.45 Y[17, 23]min=+0.19 Y[17, 30]min=+0.19
Y[18, 5]min=+0.14 Y[18, 9]min=+0.71 Y[18, 18]min=+0.14 Y[18, 24]min=+0.14
Y[19, 6]min=+0.05 Y[19, 15]min=+0.83 Y[19, 21]min=+0.05 Y[19, 31]min=+0.05
Y[20, 7]min=+1.01 Y[20, 12]min=+1.01 Y[20, 16]min=+1.04 Y[20, 29]min=+1.01
Y[21, 1]min=+0.69 Y[21, 14]min=+0.69 Y[21, 22]min=+0.69 Y[21, 28]min=+0.94
Y[22, 2]min=+0.84 Y[22, 10]min=+0.52 Y[22, 20]min=+0.52 Y[22, 25]min=+0.52
Y[23, 3]min=+0.08 Y[23, 8]min=+0.83 Y[23, 19]min=+0.08 Y[23, 27]min=+0.08

The threshold is calculated by first computing the updated bit reliabilities (comparison bit reliabilities), $Z_n$, as $$Z_n: \begin{matrix} -0.30 & +1.10 & +2.67 & +1.94 & +3.56 & -0.32 & +1.45 & +2.70 \\ -1.04 & +0.71 & +2.12 & +0.72 & +3.17 & +2.20 & +0.98 & +0.59 \\ +1.95 & -0.37 & +0.74 & +2.12 & +0.80 & +2.59 & +1.73 & +0.55 \\ +0.94 & +3.32 & +1.02 & +2.12 & -0.86 & +3.06 & +1.38 & +1.18 \end{matrix}$$

From these values of $Z_n$, the threshold is determined to be equal to −1.04. The comparison reliabilities, $Z_{mn}$, are formed and the parity check reliabilities, $Y_{mn}$, and associated hard decisions, $X_{mn}$, are updated as $Z_{mn}$:

Z[0, 0]=−0.38 Z[0, 8]=−1.26 Z[0, 16]=+1.86 Z[0, 24]=+0.86
Z[1, 4]=+2.62 Z[1, 14]=−0.46 Z[1, 21]=+1.65 Z[1, 25]=+2.38
Z[2, 5]=−0.27 Z[2, 15]=+1.30 Z[2, 22]=+1.78 Z[2, 26]=+1.08
Z[3, 6]=+1.31 Z[3, 9]=+0.25 Z[3, 23]=+0.41 Z[3, 27]=+1.98
Z[4, 7]=+3.12 Z[4, 10]=+2.54 Z[4, 17]=+0.32 Z[4, 28]=−0.44
Z[5, 1]=+0.92 Z[5, 11]=−0.05 Z[5, 18]=+0.55 Z[5, 29]=+2.88
Z[6, 2]=+1.27 Z[6, 12]=+2.65 Z[6, 19]=+1.60 Z[6, 30]=+0.87
Z[7, 3]=+1.78 Z[7, 13]=+1.37 Z[7, 20]=+0.65 Z[7, 31]=+1.02
Z[8, 0]=+0.15 Z[8, 12]=+3.39 Z[8, 23]=+0.78 Z[8, 25]=+3.54
Z[9, 4]=+3.50 Z[9, 15]=+0.17 Z[9, 17]−0.42 Z[9, 24]=+0.89
Z[10, 5]=+0.52 Z[10, 14]=+1.69 Z[10, 20]=+1.51 Z[10, 30]=+2.10
Z[11, 6]=+1.64 Z[11, 11]=+1.41 Z[11, 16]=+2.13 Z[11, 28]=−0.67
Z[12, 7]=+2.54 Z[12, 13]=+0.76 Z[12, 21]=+2.44 Z[12, 27]=+1.96

Z[13, 1]=+0.96 Z[13, 9]=−0.12 Z[13, 19]=+1.98 Z[13, 31]=+1.04
Z[14, 2]=+2.75 Z[14, 8]=−0.52 Z[14, 18]=+0.82 Z[14, 26]=+1.10
Z[15, 3]=+0.90 Z[15, 10]=+1.29 Z[15, 22]=+0.90 Z[15, 29]=+2.23
Z[16, 0]=−0.14 Z[16, 13]=+2.42 Z[16, 17]=−0.21 Z[16, 26]=+1.18
Z[17, 4]=+3.37 Z[17, 11]+0.27 Z[17, 23]+0.37 Z[17, 30]=+1.20
Z[18, 5]=−0.18 Z[18, 9]=+1.42 Z[18, 18]=+0.88 Z[18, 24]=+1.08
Z[19, 6]=+1.40 Z[19, 15]=−0.23 Z[19, 21]=+2.54 Z[19, 31]=+1.12
Z[20, 7]=+1.69 Z[20, 12]=+2.16 Z[20, 16]=+0.91 Z[20, 29]=+2.05
Z[21, 1]=+1.80 Z[21, 14]=+1.67 Z[21, 22]=+2.42 Z[21, 28]=+0.08
Z[22, 2]=+1.83 Z[22, 10]=+1.60 Z[22, 20]=+0.28 Z[22, 25]=+2.80
Z[23, 3]=+2.02 Z[23, 8]=−0.21 Z[23, 19]=+2.20 Z[23, 27]=+2.20

$Y_{mn}$:
Y[0, 0]=+0.00 Y[0, 8]=+1.26 Y[0, 16]=+1.86 Y[0, 24]=+0.86
Y[1, 4]=+2.62 Y[1, 14]=+0.00 Y[1, 21]=+1.65 Y[1, 25]=+2.38
Y[2, 5]=+0.00 Y[2, 15]=+1.30 Y[2, 22]=+1.78 Y[2, 26]=+1.08
Y[3, 6]=+1.31 Y[3, 9]=+0.25 Y[3, 23]=+0.41 Y[3, 27]=+1.98
Y[4, 7]=+3.12 Y[4, 10]=+2.54 Y[4, 17]=+0.32 Y[4, 28]=+0.00
Y[5, 1]=+0.92 Y[5, 11]=+0.00 Y[5, 18]=+0.55 Y[5, 29]=+2.88
Y[6, 2]=+1.27 Y[6, 12]=+2.65 Y[6, 19]=+1.60 Y[6, 30]=+0.87
Y[7, 3]=+1.78 Y[7, 13]=+1.37 Y[7, 20]=+0.65 Y[7, 31]=+1.02
Y[8, 0]=+0.15 Y[8, 12]=+3.39 Y[8, 23]=+0.78 Y[8, 25]=+3.54
Y[9, 4]=+3.50 Y[9, 15]=+0.17 Y[9, 17]=+0.00 Y[9, 24]=+0.89
Y[10, 5]=+0.52 Y[10, 14]=+1.69 Y[10, 20]=+1.51 Y[10, 30]=+2.10
Y[11, 6]=+1.64 Y[11, 11]=+1.41 Y[11, 16]=+2.13 Y[11, 28]=+0.00
Y[12, 7]=+2.54 Y[12, 13]=+0.76 Y[12, 21]=+2.44 Y[12, 27]=+1.96
Y[13, 1]=+0.96 Y[13, 9]=+0.00 Y[13, 19]=+1.98 Y[13, 31]=+1.04
Y[14, 2]=+2.75 Y[14, 8]=+0.00 Y[14, 18]=+0.82 Y[14, 26]=+1.10
Y[15, 3]=+0.90 Y[15, 10]=+1.29 Y[15, 22]=+0.90 Y[15, 29]=+2.23
Y[16, 0]=+0.00 Y[16, 13]=+2.42 Y[16, 17]=+0.00 Y[16, 26]=+1.18
Y[17, 4]=+3.37 Y[17, 11]=+0.27 Y[17, 23]=+0.37 Y[17, 30]=+1.20
Y[18, 5]=+0.00 Y[18, 9]=+1.42 Y[18, 18]=+0.88 Y[18, 24]=+1.08
Y[19, 6]=+1.40 Y[19, 15]=+0.00 Y[19, 21]=+2.54 Y[19, 31]=+1.12
Y[20, 7]=+1.69 Y[20, 12]=+2.16 Y[20, 16]=+0.91 Y[20, 29]=+2.05
Y[21, 1]=+1.80 Y[21, 14]=+1.67 Y[21, 22]=+2.42 Y[21, 28]=+0.08
Y[22, 2]=+1.83 Y[22, 10]=+1.60 Y[22, 20]=+0.28 Y[22, 25]=+2.80
Y[23, 3]=+2.02 Y[23, 8]=+0.00 Y[23, 19]=+2.20 Y[23, 27]=+2.20

$X_{mn}$:
X[0, 0]=1 X[0, 8]=0 X[0, 16]=X[0, 24]=1
X[1, 4]=0 X[1, 14]=1 X[1, 21]=1 X[1, 25]=0
X[2, 5]=1 X[2, 15]=1 X[2, 22]=1 X[2, 26]=0
X[3, 6]=1 X[3, 9]=0 X[3, 23]=0 X[3, 27]=1
X[4, 7]=0 X[4, 10]=1 X[4, 17]=0 X[4, 28]=0
X[5, 1]=1 X[5, 11]=1 X[5, 18]=1 X[5, 29]=1
X[6, 2]=1 X[6, 12]=0 X[6, 19]=0 X[6, 30]=1
X[7, 3]=1 X[7, 13]=0 X[7, 20]=0 X[7, 31]=1
X[8, 0]=1 X[8, 12]=0 X[8, 23]=0 X[8, 25]=0
X[9, 4]=0 X[9, 15]=1 X[9, 17]=0 X[9, 24]=1
X[10, 5]=1 X[10, 14]=1 X[10, 20]=0 X[10, 30]=1
X[11, 6]=4 X[11, 11]=1 X[11, 16]=1 X[11, 28]=0
X[12, 7]=0 X[12, 13]=0 X[12, 21]=1 X[12, 27]=1
X[13, 1]=1 X[13, 9]=0 X[13, 19]=0 X[13, 31]=1
X[14, 2]=1 X[14, 8]=1 X[14, 18]=1 X[14, 26]=0
X[15, 3]=1 X[15, 10]=1 X[15, 22]=1 X[15, 29]=1
X[16, 0]=1 X[16, 13]=0 X[16, 17]=0 X[16, 26]=0
X[17, 4]=0 X[17, 11]=1 X[17, 23]=0 X[17, 30]=1
X[18, 5]=1 X[18, 9]=0 X[18, 18]=1 X[18, 24]=1
X[19, 6]=1 X[19, 15]=1 X[19, 21]=1 X[19, 31]=1
X[20, 7]=0 X[20, 12]=0 X[20, 16]=1 X[20, 29]=1
X[21, 1]=1 X[21, 14]=1 X[21, 22]=1 X[21, 28]=0
X[22, 2]=1 X[22, 10]=1 X[22, 20]=0 X[22, 25]=0
X[23, 3]=1 X[23, 8]=1 X[23, 19]=0 X[23, 27]=1

Then a test codeword is formed as reconstructed codeword $C=\{C_i\}$:

0111001000110011

1110011010011111

The test codeword C is such that $HC^T \neq 0$, and a second iteration is made. Iteration 2 begins with computing new check sums and new minimum parity check reliabilities, $Y_{mn-min}$, as, check sums, $S_{mn}$:

S[0, 0]=1 S[0, 8]=0 S[0, 16]=1 S[0, 24]=1
S[1, 4]=0 S[1, 14]=0 S[1, 21]=0 S[1, 25]=0
S[2, 5]=1 S[2, 15]=1 S[2, 22]=1 S[2, 26]=1
S[3, 6]=0 S[3, 9]=0 S[3, 23]=0 S[3, 27]=0
S[4, 7]=1 S[4, 10]=1 S[4, 17]=1 S[4, 28]=1
S[5, 1]=0 S[5, 11]=0 S[5, 18]=0 S[5, 29]=0
S[6, 2]=0 S[6, 12]=0 S[6, 19]=0 S[6, 30]=0
S[7, 3]=0 S[7, 13]=0 S[7, 20]=0 S[7, 31]=0
S[8, 0]=1 S[8, 12]=1 S[8, 23]=1 S[8, 25]=1
S[9, 4]=0 S[9, 15]=0 S[9, 17]=0 S[9, 24]=0
S[10, 5]=1 S[10, 14]=1 S[10, 20]=1 S[10, 30]=1
S[11, 6]=1 S[11, 11]=1 S[11, 16]=1 S[11, 28]=1
S[12, 7]=0 S[12, 13]=0 S[12, 21]=0 S[12, 27]=0
S[13, 1]=0 S[13, 9]=0 S[13, 19]=0 S[13, 31]=0
S[14, 2]=1 S[14, 8]=1 S[14, 18]=1 S[14, 26]=1
S[15, 3]=0 S[15, 10]=0 S[15, 22]=0 S[15, 29]=0
S[16, 0]=1 S[16, 13]=1 S[16, 17]=1 S[16, 26]=1
S[17, 4]=0 S[17, 11]=0 S[17, 23]=0 S[17, 30]=0
S[18, 5]=1 S[18, 9]=1 S[18, 18]=1 S[18, 24]=1
S[19, 6]=0 S[19, 15]=0 S[19, 21]=0 S[19, 31]=0
S[20, 7]=0 S[20, 12]=0 S[20, 16]=0 S[20, 29]=0
S[21, 1]=1 S[21, 14]=1 S[21, 22]=1 S[21, 28]=1
S[22, 2]=0 S[22, 10]=0 S[22, 20]=0 S[22, 25]=0
S[23, 3]=1 S[23, 8]=1 S[23, 19]=1 S[23, 27]=1

$Y_{mn\text{-}min}$:
Y[0, 0]min =+0.86 Y[0, 8]min =+0.00 Y[0, 16]min =+0.00 Y[0, 24]min =+0.00
Y[1, 4]min =+0.00 Y[1, 14]min =+1.65 Y[1, 21]min = +0.00 Y[1, 25]min =+0.00
Y[2, 5]min =+1.08 Y[2, 15]min =+0.00 Y[2, 22]min = +0.00 Y[2, 26]min =+0.00
Y[3, 6]min =+0.25 Y[3, 9]min =+0.41 Y[3, 23]min =+0.25 Y[3, 27]min =+0.25
Y[4, 7]min =+0.00 Y[4, 10]min =+0.00 Y[4, 17]min = +0.00 Y[4, 28]min =+0.32
Y[5, 1]min =+0.00 Y[5, 11]min =+0.55 Y[5, 18]min = +0.00 Y[5, 29]min =+0.00
Y[6, 2]min =+0.87 Y[6, 12]min =+0.87 Y[6, 19]min = +0.87 Y[6, 30]min =+1.27
Y[7, 3]min =+0.65 Y[7, 13]min =+0.65 Y[7, 20]min = +1.02 Y[7, 31]min =+0.65
Y[8, 0]min =+0.78 Y[8, 12]min =+0.15 Y[8, 23]min = +0.15 Y[8, 25]min =+0.15
Y[9, 4]min =+0.00 Y[9, 15]min =+0.00 Y[9, 17]min = +0.17 Y[9, 24]min =+0.00
Y[10, 5]min =+1.51 Y[10, 14]min =+0.52 Y[10, 20]min = +0.52 Y[10, 30]min =+0.52
Y[11, 6]min =+0.00 Y[11, 11]min =+0.00 Y[11, 16]min = +0.00 Y[11, 28]min =+1.41
Y[12, 7]min =+0.76 Y[12, 13]min =+1.96 Y[12, 21]min = +0.76 Y[12, 27]min =+0.76
Y[13, 1]min =+0.00 Y[13, 9]min =+0.96 Y[13, 19]min = +0.00 Y[13, 31]min =+0.00
Y[14, 2]min =+0.00 Y[14, 8]min =+0.82 Y[14, 18]min = +0.00 Y[14, 26]min =+0.00
Y[15, 3]min =+0.90 Y[15, 10]min =+0.90 Y[15, 22]min = +0.90 Y[15, 29]min =+0.90
Y[16, 0]min =+0.00 Y[16, 13]min =+0.00 Y[16, 17]min = +0.00 Y[16, 26]min =+0.00
Y[17, 4]min =+0.27 Y[17, 11]min =+0.37 Y[17, 23]min = +0.27 Y[17, 30]min =+0.27
Y[18, 5]min =+0.88 Y[18, 9]min =+0.00 Y[18, 18]min = +0.00 Y[18, 24]min =+0.00
Y[19, 6]min =+0.00 Y[19, 15]min =+1.12 Y[19, 21]min = +0.00 Y[19, 31]min =+0.00
Y[20, 7]min =+0.91 Y[20, 12]min =+0.91 Y[20, 16]min = +1.69 Y[20, 29]min =+0.91
Y[21, 1]min =+0.08 Y[21, 14]min =+0.08 Y[21, 22]min = +0.08 Y[21, 28]min =+1.67
Y[22, 2]min =+0.28 Y[22, 10]min =+0.28 Y[22, 20]min = +1.60 Y[22, 25]min =+0.28
Y[23, 3]min =+0.00 Y[23, 8]min =+2.02 Y[23, 19]min = +0.00 Y[23, 27]min =+0.00

The threshold has been assigned for iterations 1, 2, and 3 as the minimum value of the updated bit reliabilities (comparison bit reliabilities), $Z_n$, calculated in the first iteration. Thus, in this iteration the threshold is set at −1.04 as in the first iteration. The updated bit reliabilities (comparison bit reliabilities), $Z_n$, for the second iteration are determined to be:

$$Z_n: \begin{matrix} -1.41 & +1.39 & +1.67 & +2.38 & +2.65 & -2.76 & +1.70 & +3.62 \\ -2.76 & +1.52 & +2.37 & +1.11 & +3.48 & +2.77 & +1.99 & +1.18 \\ +2.70 & +0.59 & +0.78 & +2.41 & +2.94 & +2.20 & +2.46 & +0.83 \\ +0.94 & +2.21 & +1.31 & +2.92 & -2.72 & +2.85 & +2.42 & +1.47 \end{matrix}$$

The second iteration comparison reliabilities, $Z_{mn}$, are formed and the second iteration parity check reliabilities, $Y_{mn}$, and associated hard decisions, $X_{mn}$, are updated as $Z_{mn}$:
Z[0, 0]=−0.38 Z[0, 8]=−1.26 Z[0, 16]=+1.86 Z[0, 24]=+0.86
Z[0, 0]=−0.55 Z[0, 8]=−2.76 Z[0, 16]=+2.70 Z[0, 24]=+0.94
Z[1, 4]=+2.65 Z[1, 14]=+0.34 Z[1, 21]=+2.20 Z[1, 25]=+2.21
Z[2, 5]=−1.68 Z[2, 15]=+1.18 Z[2, 22]=+2.46 Z[2, 26]=+1.31
Z[3, 6]=+1.44 Z[3, 9]=+1.10 Z[3, 23]=+0.57 Z[3, 27]=+2.67
Z[4, 7]=+3.62 Z[4, 10]=+2.37 Z[4, 17]=+0.59 Z[4, 28]=−2.40
Z[5, 1]=+1.39 Z[5, 11]=+0.55 Z[5, 18]=+0.78 Z[5, 29]=+2.85
Z[6, 2]=+0.80 Z[6, 12]=+2.62 Z[6, 19]=+1.54 Z[6, 30]=+1.15
Z[7, 3]=+1.73 Z[7, 13]=+2.12 Z[7, 20]=+1.92 Z[7, 31]=+0.83
Z[8, 0]=−0.63 Z[8, 12]=+3.64 Z[8, 23]=+0.98 Z[8, 25]=+2.37
Z[9, 4]=+2.65 Z[9, 15]+1.18 Z[9, 17]=+0.42 Z[9, 24]+0.94
Z[10, 5]=−1.24 Z[10, 14]=+2.51 Z[10, 20]=+3.46 Z[10, 30]=+2.94
Z[11, 6]=+1.70 Z[11, 11]=+1.11 Z[11, 16]=+2.70 Z[11, 28]=−1.30
Z[12, 7]=+2.86 Z[12, 13]=+0.80 Z[12, 21]=+1.44 Z[12, 27]=+2.16
Z[13, 1]=+1.39 Z[13, 9]=+0.55 Z[13, 19]=+2.41 Z[13, 31]=+1.47
Z[14, 2]=+1.67 Z[14, 8]=−1.94 Z[14, 18]=+0.78 Z[14, 26]=+1.31
Z[15, 3]=+1.47 Z[15, 10]=+1.48 Z[15, 22]=+1.56 Z[15, 29]=+1.95
Z[16, 0]=−1.41 Z[16, 13]=+2.77 Z[16, 17]=+0.59 Z[16, 26]=+1.31
Z[17, 4]=+2.38 Z[17, 11]=+0.74 Z[17, 23]=+0.55 Z[17, 30]=+2.15
Z[18, 5]=−1.88 Z[18, 9]=+1.52 Z[18, 18]=+0.78 Z[18, 24]=+0.94
Z[19, 6]=+1.70 Z[19, 15]=+0.05 Z[19, 21]=+2.20 Z[19, 31]=+1.47
Z[20, 7]=+2.71 Z[20, 12]=+2.58 Z[20, 16]=+1.01 Z[20, 29]=+1.94
Z[21, 1]=+1.47 Z[21, 14]=+2.08 Z[21, 22]=+2.55 Z[21, 28]=−1.04
Z[22, 2]=+1.38 Z[22, 10]=+2.09 Z[22, 20]=+1.34 Z[22, 25]=+1.93
Z[23, 3]=+2.38 Z[23, 8]=−0.74 Z[23, 19]=+2.41 Z[23, 27]=+2.92

$Y_{mn}$:
Y[0, 0]=+0.00 Y[0, 8]=+2.76 Y[0, 16]=+2.70 Y[0, 24]=+0.94
Y[1, 4]=+2.65 Y[1, 14]=+0.34 Y[1, 21]=+2.20 Y[1, 25]=+2.21
Y[2, 5]=+1.68 Y[2, 15]=+1.18 Y[2, 22]=+2.46 Y[2, 26]=+1.31
Y[3, 6]=+1.44 Y[3, 9]=+1.10 Y[3, 23]=+0.57 Y[3, 27]=+2.67
Y[4, 7]=+3.62 Y[4, 10]=+2.37 Y[4, 17]=+0.59 Y[4, 28]=+2.40
Y[5, 1]=+1.39 Y[5, 11]=+0.55 Y[5, 18]=+0.78 Y[5, 29]=+2.85

Y[6, 2]=+0.80 Y[6, 12]=+2.62 Y[6, 19]=+1.54 Y[6, 30]=+1.15

Y[7, 3]=+1.73 Y[7, 13]=+2.12 Y[7, 20]=+1.92 Y[7, 31]=+0.83

Y[8, 0]=+0.00 Y[8, 12]=+3.64 Y[8, 23]=+0.98 Y[8, 25]=+2.37

Y[9, 4]=+2.65 Y[9, 15]=+11.18 Y[9, 17]=+0.42 Y[9, 24]=+0.94

Y[10, 5]=+1.24 Y[10, 14]=+2.51 Y[10, 20]=+3.46 Y[10, 30]=+2.94

Y[11, 6]=+1.70 Y[11, 11]=+1.11 Y[11, 16]=+2.70 Y[11, 28]=+1.30

Y[12, 7]=+2.86 Y[12, 13]=+0.80 Y[12, 21]=+1.44 Y[12, 27]=+2.16

Y[13, 1]=+1.39 Y[13, 9]=+0.55 Y[13, 19]=+2.41 Y[13, 31]=+1.47

Y[14, 2]=+1.67 Y[14, 8]=+1.94 Y[14, 18]=+0.78 Y[14, 26]=+1.31

Y[15, 3]=+1.47 Y[15, 10]=+1.48 Y[15, 22]=+1.56 Y[15, 29]=+1.95

Y[16, 0]=+1.41 Y[16, 13]=+2.77 Y[16, 17]=+0.59 Y[16, 26]=+1.31

Y[17, 4]=+2.38 Y[17, 11]=+0.74 Y[17, 23]=+0.55 Y[17, 30]=+2.15

Y[18, 5]=+1.88 Y[18, 9]=+1.52 Y[18, 18]=+0.78 Y[18, 24]=+0.94

Y[19, 6]=+1.70 Y[19, 15]=+0.05 Y[19, 21]=+2.20 Y[19, 31]=+1.47

Y[20, 7]=+2.71 Y[20, 12]=+2.58 Y[20, 16]=+1.01 Y[20, 29]=+1.94

Y[21, 1]=+1.47 Y[21, 14]=+2.08 Y[21, 22]=+2.55 Y[21, 28]=+1.04

Y[22, 2]=+1.38 Y[22, 10]=+2.09 Y[22, 20]=+1.34 Y[22, 25]=+1.93

Y[23, 3]=+2.38 Y[23, 8]=+0.00 Y[23, 19]=+2.41 Y[23, 27]=+2.92

$X_{mn}$:

X[0, 0]=1 X[0, 8]=0 X[0, 16]=1 X[0, 24]=1
X[1, 4]=0 X[1, 14]=1 X[1, 21]=1 X[1, 25]=0
X[2, 5]=0 X[2, 15]=1 X[2, 22]=1 X[2, 26]=0
X[3, 6]=1 X[3, 9]=0 X[3, 23]=0 X[3, 27]=1
X[4, 7]=0 X[4, 10]=1 X[4, 17]=0 X[4, 28]=1
X[5, 1]=1 X[5, 11]=1 X[5, 18]=1 X[5, 29]=1
X[6, 2]=1 X[6, 12]=0 X[6, 19]=0 X[6, 30]=1
X[7, 3]=1 X[7, 13]=0 X[7, 20]=0 X[7, 31]=1
X[8, 0]=1 X[8, 12]=0 X[8, 23]=0 X[8, 25]=0
X[9, 4]=0 X[9, 15]=1 X[9, 17]=0 X[9, 24]=1×
X[10, 5]=0 X[10, 14]=1 X[10, 20]=0 X[10, 30]=1
X[11, 6]=1 X[11, 11]=1 X[11, 16]=1 X[11, 28]=1
X[12, 7]=0 X[12, 13]=0 X[12, 21]=1 X[12, 27]=1
X[13, 1]=1 X[13, 9]=0 X[13, 19]=0 X[13, 31]=1
X[14, 2]=1 X[14, 8]=0 X[14, 18]=1 X[14, 26]=0
X[15, 3]=1 X[15, 10]=1 X[15, 22]=1 X[15, 29]=1
X[16, 0]=0 X[16, 13]=0 X[16, 17]=0 X[16, 26]=0×
X[17, 4]=0 X[17, 11]=1 X[17, 23]=0 X[17, 30]=1
X[18, 5]=0 X[18, 9]=0 X[18, 18]=1 X[18, 24]=1
X[19, 6]=1 X[19, 15]=1 X[19, 21]=1 X[19, 31]=1
X[20, 7]=0 X[20, 12]=0 X[20, 16]=1 X[20, 29]=1
X[21, 1]=1 X[21, 14]=1 X[21, 22]=1 X[21, 28]=1
X[22, 2]=1 X[22, 10]=11 X[22, 20]=0 X[22, 25]=0×
X[23, 3]=1 X[23, 8]=1 X[23, 19]=0 X[23, 27]=1

Then the test codeword is formed as reconstructed codeword $C=\{C_i\}$:

0111001000110011

1010011010011111

The test codeword C is such that $HC^T=0$, and the decoding is ended with the decoding considered as successful. Iterations 3-5 are not needed in this example, and the iterations are terminated. Though a second value was selected and scheduled for use in iterations 4 and 5, it was not needed. This example of an implementation of an embodiment for a multiple threshold decoding scheme and is not intended as a limitation to the various embodiments of the present invention.

Various embodiments for decoding a received codeword using a multi-valued threshold can be applied to any low density parity check code. In such embodiments, as the weight of the parity check weight is decreased, the decoding quality is increased. These embodiments may be applied in a method providing small complexity to the decoding scheme. Various combinations for providing the multiple threshold values during the iteration process can be used depending on the allowable complexity desired for a given application. Additional reduction in complexity is provided using embodiments of the multiple-threshold decoding method since these embodiments can be operate in hardware implementations without floating point numbers, which eliminates complexity and expense. Embodiments for a multiple-threshold decoding scheme allows for pipeline and/or parallel processing in hardware implementations since the use of a multi-valued threshold can provide a fast decoding scheme.

Embodiments for a multiple-threshold decoding scheme may be adapted to be used in any system operating with a communication channel. The communication channel may be part of a land based communication network or a wireless communication network. Indeed, embodiments of the present invention may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and similar communication systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
iteratively decoding a received codeword using a bit reliability such that for each iteration the bit reliability is updated based on a comparison using a threshold, wherein the threshold is updated to provide multiple threshold values during the iterative decoding, the received codeword being a low-density parity check codeword.

2. The method of claim 1, wherein the low-density parity check codeword is based on a Reed Solomon code with two information symbols.

3. The method of claim 1, wherein the method includes correcting one or more bits of a test codeword based on a comparison of the updated bit reliability with the threshold to provide a valid codeword, the test codeword initially generated from the received codeword.

4. The method of claim 1, wherein using a threshold includes using the threshold with a value computed using a minimum comparison reliability of a set of comparison reliabilities, each comparison reliability computed based on an initial bit reliability and a set of parity check reliabilities.

5. The method of claim 1, wherein the method includes performing a soft decision process on each bit of the received codeword to generate a received vector from which a hard decision vector and bit reliabilities are generated.

6. The method of claim 5, wherein for each bit of the received vector, a bit reliability is generated as the absolute value of the bit of the received vector.

7. The method of claim 5, wherein the method includes computing a parity check reliability for each parity check of a set of parity checks of the received codeword.

8. The method of claim 7, wherein the method includes:
forming a first comparison reliability based on an initial bit reliability related to a bit of the hard decision vector and on a first subset of the parity check reliabilities;
comparing the first comparison reliability with the threshold;
updating a parity check reliability based on comparing the first comparison reliability with the threshold;
forming a second comparison reliability based on the initial bit reliability and on a second subset of the parity check reliabilities;
updating a bit of a test codeword based on comparing the second comparison reliability with a set value; and
determining if the test codeword is a valid codeword.

9. The method of claim 8, wherein updating a bit of a test codeword includes flipping the bit.

10. The method of claim 8, wherein updating a bit of a test codeword based on comparing the second comparison reliability with a set value includes updating a bit of a test codeword based on comparing the second comparison reliability with zero.

11. The method of claim 1, wherein iteratively decoding a received codeword includes performing a number of iterations, the number of iterations equal to $\log_2 n$, where n is a code length of the codeword.

12. A method comprising:
receiving information bits;
encoding the information bits to provide a codeword; and
transmitting the codeword, wherein encoding the information bits provides a received codeword acquired from transmitting the encoded codeword, the received codeword adapted to iterative decoding using a bit reliability such that for each iteration the bit reliability is updated based on a comparison using a threshold, wherein the threshold is updated to provide multiple threshold values during the iterative decoding, the received codeword being a low-density parity check codeword.

13. The method of claim 12, wherein the low-density parity check codeword is based on a Reed Solomon code with two information symbols.

14. The method of claim 13, wherein the method includes providing low-density parity check code parameters that are also provided to a decoding process.

15. The method of claim 12, wherein transmitting the codeword wirelessly transmitting the codeword.

16. A computer-readable medium having computer-executable instructions for performing a method comprising:
iteratively decoding a received codeword using a bit reliability such that for each iteration the bit reliability is updated based on a comparison using a threshold, wherein the threshold is updated to provide multiple threshold values during the iterative decoding, the received codeword being a low-density parity check codeword.

17. The computer-readable medium of claim 16, wherein the method includes correcting one or more bits of a test codeword initially generated from the received codeword to provide a valid codeword.

18. The computer-readable medium of claim 16, wherein the method includes providing a message word from the received codeword after iteratively decoding the received codeword.

19. The computer-readable medium of claim 16, wherein the method includes performing a soft decision process on each bit of the received codeword to generate a received vector from which a hard decision vector and bit reliabilities are generated.

20. The computer-readable medium of claim 16, wherein using a threshold includes using the threshold with a value computed using a minimum comparison reliability of a set of comparison reliabilities, each comparison reliability computed based on an initial bit reliability and a set of parity check reliabilities.

21. The computer-readable medium of claim 16, wherein the computer-readable medium is a component of a wireless device.

22. A computer-readable medium having computer-executable instructions for performing a method comprising:
receiving information bits;
encoding the information bits to provide an encoded codeword; and
transmitting the encoded codeword, wherein encoding the information bits provides a received codeword acquired from transmitting the encoded codeword, the received codeword adapted to iterative decoding using a bit reliability such that for each iteration the bit reliability is updated based on a comparison using a threshold, wherein the threshold is updated to provide multiple threshold values during the iterative decoding, the received codeword being a low-density parity check codeword.

23. The computer-readable medium of claim 22, wherein the low-density parity check codeword is based on a Reed Solomon code with two information symbols.

24. The computer-readable medium of claim 23, wherein the method includes providing low-density parity check code parameters that are also provided to a decoding process.

25. The computer-readable medium of claim 22, wherein the computer-readable medium is a component of a wireless system.

26. An apparatus comprising:
a receiver;
a bit reliability generator to provide a set of bit reliabilities, each bit reliability corresponding to a bit of a received codeword acquired by the receiver; and
a comparison unit using a threshold such that for each iteration of an iterative process to decode the received codeword the bit reliability is updated based on a comparison using the threshold, wherein the threshold is updated to provide multiple threshold values during the iterative decoding.

27. The apparatus of claim 26, further including a soft decision unit to process each bit of the received codeword to generate a received vector from which a hard decision vector and the set of bit reliabilities are generated.

28. The apparatus of claim 27, further including:
a first reliability computation unit to compute a parity check reliability for each parity check of a set of parity checks of the received codeword,
a second reliability computation unit to compute a first comparison reliability based on an initial bit reliability related to a bit of the hard decision vector and on a first subset of the parity check reliabilities;
a first comparison unit to compare the first comparison reliability with the threshold to update a parity check reliability based on comparing the first comparison reliability with the threshold;
a third reliability computation unit to compute a second comparison reliability based on the initial bit reliability and on a second subset of the parity check reliabilities;
a second comparison unit to determine if a test codeword is a valid codeword, wherein the test codeword is a version of the received codeword updated based on comparing the second comparison reliability with a set value.

29. The apparatus of claim 28, wherein each reliability computation unit and each comparison are included in a common threshold decoder.

30. The apparatus of claim 29, wherein the common threshold decoder is adapted to provide information bits from the valid codeword.

31. The apparatus of claim 26, wherein the apparatus is a wireless device.

32. An apparatus comprising:
a transmitter;
an encoder to encode information bits for transmission by the transmitter, wherein the encoder is adapted to encode the information bits such that a received codeword received from a medium on which the encoded information bits is transmitted is iteratively decoded to produce the information bits, the iterative decoding conducted using a bit reliability such that for each iteration the bit reliability is updated based on a comparison using a threshold, wherein the threshold is updated to provide multiple threshold values during the iterative decoding, the received codeword being a low-density parity check codeword.

33. The apparatus of claim 32, wherein the low-density parity check codeword is based on a Reed Solomon code with two information symbols.

34. The apparatus of claim 33, further including a h-matrix construction adapted to use low-density parity check code parameters common to decoding units receiving a version of the transmitted information bits.

35. The apparatus of claim 32, wherein the apparatus is a stationary wireless device.

36. A system comprising:
a processor;
a substantially omnidirectional antenna to receive a signal;
a receiver to acquire a received codeword from the signal;
a decoder to iteratively decode the received codeword acquired by the receiver, the decoder including:
a bit reliability generator to provide a set of bit reliabilities, each bit reliability corresponding to a bit of the received codeword; and
a comparison unit using a threshold such that, for each iteration to iteratively decode the received codeword, the bit reliability is updated based on a comparison using the threshold, wherein the threshold is updated to provide multiple threshold values during the iterative decoding; and
a memory coupled to the processor, the memory to store parameters used to iteratively decode the received codeword.

37. The system of claim 36, wherein the system is a portable wireless system.

38. The system of claim 36, wherein decoder is adapted to decode a low-density parity check codeword.

39. The system of claim 36, wherein the bit reliability generator and the comparison unit are components of a threshold decoder adapted to use updated threshold values to determine a valid codeword and to provide information bits from the valid codeword.

40. A system comprising:
a processor;
a transmitter;
an encoder to encode information bits for transmission by the transmitter, wherein the encoder is adapted to encode the information bits such that a received codeword received from a medium on which the encoded information bits are transmitted is iteratively decoded to produce the information bits, the iterative decoding conducted using a bit reliability such that, for each iteration, the bit reliability is updated based on a comparison using a threshold, wherein the threshold is updated to provide multiple threshold values during the iterative decoding, the received codeword being a low-density parity check codeword; and
a memory coupled to the processor, the memory to store parameters used to iteratively encode the received codeword; and
a substantially omnidirectional antenna coupled to the transmitter.

41. The system of claim 40, wherein the system is a stationary wireless system.

42. The system of claim 41, wherein the low-density parity check codeword is based on a Reed Solomon code with two information symbols.

43. A system comprising:
a processor;
a receiver to acquire a received codeword in the signal, the receiver adapted to couple to a land based communication network;
a decoder to iteratively decode the received codeword acquired by the receiver, the decoder including:
a bit reliability generator to provide a set of bit reliabilities, each bit reliability corresponding to a bit of the received codeword; and
a comparison unit using a threshold such that, for each iteration to iteratively decode the received codeword, the bit reliability is updated based on a comparison using the threshold, wherein the threshold is updated to provide multiple threshold values during the iterative decoding; and a memory coupled to the processor, the memory to store parameters used to iteratively decode the received codeword.

44. The system of claim 43, wherein the system is adapted to connect to a fiber optic communication network.

45. The system of claim 43, wherein decoder is adapted to decode a low-density parity check codeword.

46. The system of claim 43, wherein the bit reliability generator and the comparison unit are components of a threshold decoder adapted to use updated threshold values to determine a valid codeword and to provide information bits from the valid codeword.

* * * * *

UNITED STATES PATENT AND TRADEMARK OFFICE
CERTIFICATE OF CORRECTION

PATENT NO. : 7,716,561 B2 Page 1 of 1
APPLICATION NO. : 11/466292
DATED : May 11, 2010
INVENTOR(S) : Andrey V. Belogolovy et al.

It is certified that error appears in the above-identified patent and that said Letters Patent is hereby corrected as shown below:

On the Title page, in field (75), in "Inventors", in column 1, line 1, delete "Belogolovyi," and insert -- Belogolovy, --, therefor.

In column 23, line 20, in Claim 28, delete "codeword," and insert -- codeword; --, therefor.

Signed and Sealed this

Thirteenth Day of July, 2010

David J. Kappos
*Director of the United States Patent and Trademark Office*